(12) United States Patent
Zhu

(10) Patent No.: US 11,670,197 B2
(45) Date of Patent: Jun. 6, 2023

(54) FLEXIBLE DISPLAY PANEL INCLUDING INSULATION LAYER AS BASE SUBSTRATE, MANUFACTURING METHOD FOR THE SAME, AND DISPLAY DEVICE

(71) Applicant: BOE TECHNOLOGY GROUP CO., LTD., Beijing (CN)

(72) Inventor: Xiaoyan Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 136 days.

(21) Appl. No.: 17/218,462

(22) Filed: Mar. 31, 2021

(65) Prior Publication Data
US 2021/0319725 A1    Oct. 14, 2021

(30) Foreign Application Priority Data

Apr. 10, 2020   (CN) .......................... 202010277988.1

(51) Int. Cl.
| | |
|---|---|
| G09F 9/30 | (2006.01) |
| H10K 59/38 | (2023.01) |
| H10K 59/122 | (2023.01) |
| H10K 59/126 | (2023.01) |
| H10K 77/10 | (2023.01) |
| H10K 71/00 | (2023.01) |
| H10K 102/00 | (2023.01) |
| H01L 27/32 | (2006.01) |
| H01L 51/00 | (2006.01) |
| H01L 51/56 | (2006.01) |

(52) U.S. Cl.
CPC ............ *G09F 9/301* (2013.01); *H01L 27/322* (2013.01); *H01L 27/3246* (2013.01); *H01L 27/3272* (2013.01); *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2018/0212006 A1* | 7/2018 | Yamazaki | H05B 33/02 |
| 2018/0334541 A1* | 11/2018 | Jeong | B32B 27/308 |
| 2019/0363220 A1* | 11/2019 | Kim | H01L 27/1248 |
| 2020/0119116 A1* | 4/2020 | Kim | H01L 27/3258 |
| 2020/0172675 A1* | 6/2020 | Radu | C08G 73/1039 |
| 2020/0280017 A1* | 9/2020 | Helander | C09K 11/06 |
| 2020/0321563 A1* | 10/2020 | Moon | H01L 51/56 |
| 2021/0036246 A1* | 2/2021 | Fujiwara | H05B 33/02 |
| 2021/0040266 A1* | 2/2021 | Jiang | C08G 73/1021 |

* cited by examiner

*Primary Examiner* — J. E. Schoenholtz
(74) *Attorney, Agent, or Firm* — Westman, Champlin & Koehler, P.A.

(57) ABSTRACT

A flexible display panel, a manufacturing method for the flexible display panel, and a display device are provided. The flexible display panel includes a packaging layer, a driving circuit layer and an insulation layer. The insulation layer serves as a base of the flexible display panel and is located at a side of the driving circuit layer distal to the packaging layer, each of a CTE and a light transmittance of the insulation layer is within a respective predetermined range, the CTE of the insulation layer is smaller than a first threshold, the light transmittance of the insulation layer is greater than a second threshold, the first threshold is within a range of 5 to 15, and the second threshold is within a range of 90% to 99%.

19 Claims, 3 Drawing Sheets

FLEXIBLE DISPLAY PANEL INCLUDING INSULATION LAYER AS BASE SUBSTRATE, MANUFACTURING METHOD FOR THE SAME, AND DISPLAY DEVICE

CROSS-REFERENCE TO RELATED APPLICATION

This application claims a priority of the Chinese patent application No. 202010277988.1 filed in China on Apr. 10, 2020, which is incorporated herein by reference in its entirety.

TECHNICAL FIELD

The present disclosure relates to the field of display technology, in particular to a flexible display panel, a manufacturing method for the flexible display panel, and a display device.

BACKGROUND

In the related art, a base of a flexible rollable display device is made of Colorless Polyimide (CPI). However, for CPI, a light transmittance is in direct proportion to a Coefficient of Thermal Expansion (CTE). When the light transmittance of CPI is relatively high, the CTE of CPI may also be relatively high. At this time, after an inorganic film layer is deposited on a surface of the display device and peeled off, the display device may be rolled up seriously, so it is impossible to meet the requirement on flatness. In addition, in the related art, the base made of CPI has a relatively large thickness, so there is a large distance between a packaging layer of the display device and a neutral layer, resulting in a relatively large bending stress. When bending the display device, the packaging layer has a risk of taking no effect.

SUMMARY

An object of the present disclosure is to provide a flexible display panel, a manufacturing method for the flexible display panel, and a display device.

In one aspect, the present disclosure provides in some embodiments a flexible display panel, including a packaging layer, a driving circuit layer and an insulation layer. The insulation layer serves as a base of the flexible display panel and is located at a side of the driving circuit layer distal to the packaging layer, each of a CTE and a light transmittance of the insulation layer is within a respective predetermined range, the CTE of the insulation layer is smaller than a first threshold, the light transmittance of the insulation layer is greater than a second threshold, the first threshold is within a range of 5 to 15, and the second threshold is within a range of 90% to 99%.

In a possible embodiment of the present disclosure, the driving circuit layer is arranged on the insulation layer. The flexible display panel further includes: an anode layer arranged at a side of the driving circuit layer distal to the insulation layer and connected to an output electrode of a driving Thin Film Transistor (TFT) in the driving circuit layer; a pixel definition layer arranged at a side of the anode layer distal to the insulation layer; a light-emitting layer arranged at a side of the pixel definition layer distal to the insulation layer; and a cathode layer arranged at a side of the light-emitting layer distal to the insulation layer. The packaging layer is arranged at a side of the cathode layer distal to the insulation layer.

In a possible embodiment of the present disclosure, the flexible display panel further includes an insulation support layer arranged between the insulation layer and the driving circuit layer and configured to ensure a structural strength of the flexible display panel.

In a possible embodiment of the present disclosure, the insulation support layer is of a Silicon On Glass (SOG) structure and a thickness of the insulation support layer is greater than 2 μm.

In a possible embodiment of the present disclosure, the flexible display panel further includes a light-shielding layer arranged between the insulation layer and the driving circuit layer, and an orthogonal projection of an active layer of the TFT in the driving circuit layer onto the insulation layer is within an orthogonal projection of the light-shielding layer onto the insulation layer.

In a possible embodiment of the present disclosure, the flexible display panel further includes a light-shielding layer arranged between the insulation layer and the driving circuit layer, an orthogonal projection of an active layer of the TFT in the driving circuit layer onto the insulation layer is within an orthogonal projection of the light-shielding layer onto the insulation layer, the light-shielding layer is made of metal, and two opposite surfaces of the light-shielding layer are in contact with the insulation layer and the insulation support layer respectively.

In a possible embodiment of the present disclosure, the flexible display panel further includes a buffer layer arranged at a side of the active layer proximate to the insulation layer, and a thickness of the insulation layer is within a range of 0.6 μm to 3 μm.

In a possible embodiment of the present disclosure, the flexible display panel further includes an auxiliary electrode arranged between the cathode layer and the packaging layer and connected in parallel to the cathode layer, and an orthogonal projection of the auxiliary electrode onto the insulation layer overlaps an orthogonal projection of the pixel definition layer onto the insulation layer at an overlapping region.

In a possible embodiment of the present disclosure, the cathode layer includes a first portion and a second portion other than the first portion, a thickness of the first portion is greater than a thickness of the second portion, and an orthogonal projection of the first portion onto the insulation layer coincides with the orthogonal projection of the auxiliary electrode onto the insulation layer.

In a possible embodiment of the present disclosure, the flexible display panel further includes: a color filter layer arranged at a side of the packaging layer distal to the insulation layer; and a packaging cover plate arranged at a side of the color filter layer distal to the insulation layer.

In a possible embodiment of the present disclosure, the packaging cover plate is made of CPI.

In a possible embodiment of the present disclosure, the flexible display panel includes a light-transmitting region and a light-emitting region, and the anode layer and the light-shielding layer are arranged at only the light-emitting region.

In a possible embodiment of the present disclosure, the insulation layer is made of an inorganic insulation material and a thickness of the insulation layer is within a range of 100 nm to 800 nm, or the insulation layer is made of an organic resin and a thickness of the insulation layer is within a range of 0.6 μm to 3 μm, or the insulation layer is made of an organic insulation material and a thickness of the insulation layer is within a range of 1 μm to 3 μm.

In a possible embodiment of the present disclosure, the flexible display panel further includes a planarization layer arranged at a side of the driving circuit layer distal to the insulation layer, and the anode layer is connected to the output electrode through a via-hole penetrating through the planarization layer.

In another aspect, the present disclosure provides in some embodiments a display device including the above-mentioned flexible display panel.

In yet another aspect, the present disclosure provides in some embodiments a method for manufacturing a flexible display panel, including: providing a rigid support plate; forming a transitional flexible base on the rigid support plate; forming a sacrificing layer on the transitional flexible base; forming an insulation layer on the sacrificing layer, wherein each of a CTE and a light transmittance of the insulation layer is within a respective predetermined range; forming a driving circuit layer and a light-emitting element on the insulation layer, the light-emitting element including an anode layer, a pixel definition layer, a light-emitting layer and a cathode layer; forming a packaging layer covering the light-emitting element; peeling the transitional flexible base off from the sacrificing layer; and removing the sacrificing layer.

In a possible embodiment of the present disclosure, the CTE of the insulation layer is smaller than a first threshold, the light transmittance of the insulation layer is greater than a second threshold, the first threshold is within a range of 5 to 15, and the second threshold is within a range of 90% to 99%.

In a possible embodiment of the present disclosure, the forming the transitional flexible base on the rigid support plate includes forming the transitional flexible base on the rigid support plate through a coating process, and the transitional flexible substrate is made of polyimide.

In a possible embodiment of the present disclosure, the removing the sacrificing layer includes removing the sacrificing layer through an ashing process.

In a possible embodiment of the present disclosure, a thickness of the transitional flexible substrate is within a range of 5 μm to 10 μm, and a thickness of the sacrificing layer is within a range of 300 Å to 700 Å.

DETAILED DESCRIPTION

In order to make the objects, the technical solutions and the advantages of the present disclosure more apparent, the present disclosure will be described hereinafter in a clear manner in conjunction with the drawings and embodiments.

CPI has a light transmittance greater than 90% and a CTE greater than 20, so when a base of a flexible display panel is made of CPI, the flexible display panel may be rolled up seriously during the manufacture. In addition, transparency of the flexible display panel may be adversely affected by the light transmittance of CPI to some extent. In the related art, a thickness of the base made of CPI exceeds 10 μm, so a neutral layer of the flexible display panel moves downward, and a packaging layer is located far away from the neutral layer, resulting in a relatively large bending stress. When bending a display device, the packaging layer has a risk of taking no effect, and thereby a yield of the flexible display panel is adversely affected.

An object of the present disclosure is to provide a flexible display panel, a manufacturing method for the flexible display panel, and a display device, so as to improve the yield of the flexible display panel.

Figure 1:
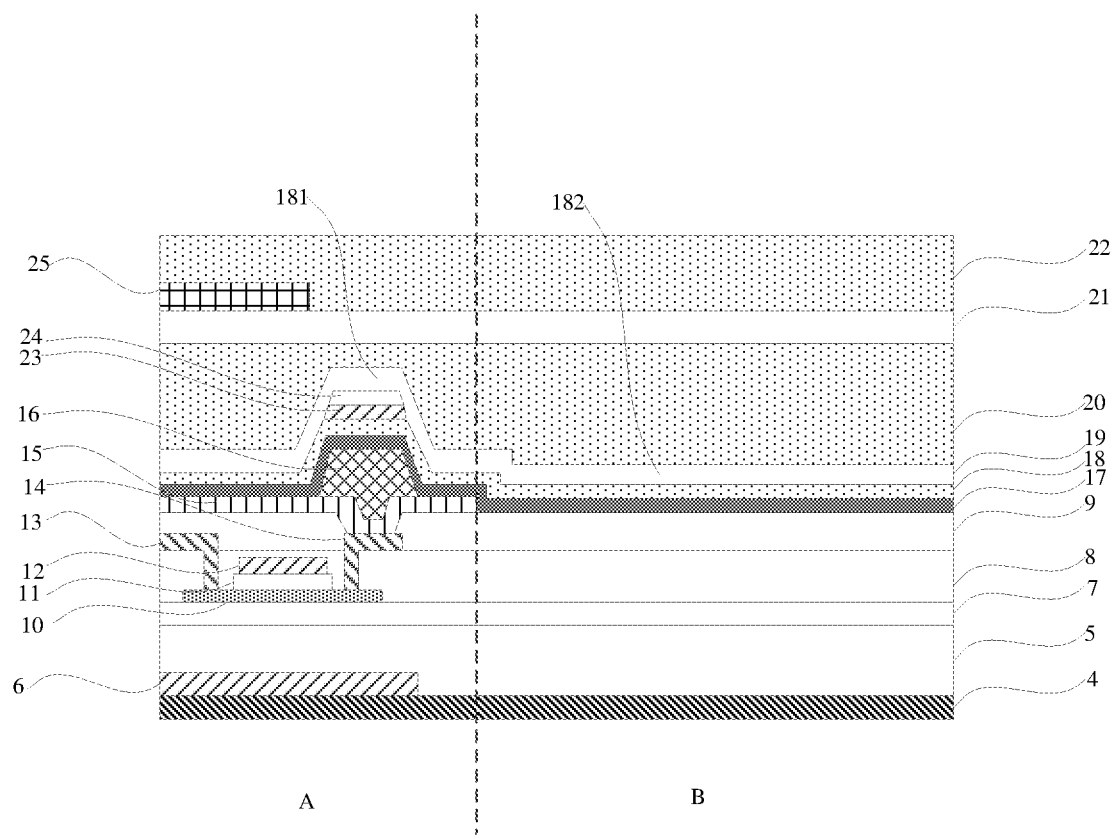
FIG. 1 is a schematic view showing a flexible display panel according to an embodiment of the present disclosure.

The present disclosure provides in some embodiments a flexible display panel which, as shown in FIG. 1, includes an insulation layer 4, a driving circuit layer, an anode layer 15, a pixel definition layer 16, a light-emitting layer 17, a cathode layer 18, and a packaging layer.

A CTE of the insulation layer 4 may be less than a first threshold and a light transmittance of the insulation layer 4 may be greater than a second threshold. As shown in FIG. 1, the insulation layer 4 serves as a base of the flexible display panel, and when its light transmittance is too low, display quality of the display panel may be adversely affected. In addition, when the CTE of the insulation layer 4 is too high, during the manufacture of the flexible display panel, after an inorganic film layer is deposited on a surface of a display device and peeled off, the display device may be rolled up seriously, so it is impossible to meet the requirement on flatness, and a yield of a display substrate is too low. In the embodiments of the present disclosure, an appropriate insulation layer 4 may be selected in such a manner that its CTE and light transmittance meet the corresponding threshold requirements, so as to ensure the display quality of the flexible display panel and the yield of the flexible display panel. To be specific, the insulation layer 4 may be made of an inorganic insulation material, e.g., SiN, SiO, SiON or $Al_2O_3$. The insulation layer 4 may alternatively be made of an organic resin and have a thickness of 0.6 μm to 3 μm. When the insulation layer 4 is made of the inorganic insulation material, it may have a thickness of 100 nm to 800 nm, and when the insulation layer 4 is made of the organic insulation material, it may have a thickness of 1 μm to 3 μm, but it is necessary to ensure that the CTE of the insulation layer 4 is relatively small. The first threshold may be within a range of 5 to 15, e.g., 10. The light transmittance of the insulation layer 4 is required to be high, so as to prevent a display effect of the display panel from being adversely affected. The second threshold may be within a range of 90% to 99%, e.g., 95%. When the insulation layer 4 is made of the inorganic insulation material, e.g., SiN, SiO, SiON or $Al_2O_3$, to form the base of the display panel, it is able for the insulation layer 4 to effectively prevent external air and moisture from entering the display panel due to such advantages of the inorganic insulation material as high temperature resistance, being hard to aging, and high mechanical strength.

The driving circuit layer may be arranged on the insulation layer 4, and include such film layers as a TFT, a gate line and a data line. The TFT may include an active layer 10, a gate insulation layer 11, a gate electrode 12, a source electrode 13, a drain electrode 14 and an interlayer insulation layer 8. The anode layer 15 may be arranged at a side of the driving circuit layer distal to the insulation layer 4, and connected to an output electrode of a driving TFT in the driving circuit layer. The output electrode may be, e.g., the drain electrode 14 of the TFT. The pixel definition layer 16 may be arranged at a side of the anode layer 15 distal to the insulation layer 4 and configured to define a plurality of pixel regions. The light-emitting layer 17 may be arranged at a side of the pixel definition layer 16 distal to the insulation layer 4. The cathode layer 18 may be arranged at a side of the light-emitting layer 17 distal to the insulation layer 4. The packaging layer may be arranged at a side of the cathode layer 18 distal to the insulation layer 4. To be specific, the packaging layer may include a first inorganic packaging layer 19, a second organic packaging layer 20 and a third inorganic packaging layer 21 laminated one on another.

In the embodiments of the present disclosure, the flexible display panel may include the insulation layer and the display elements on the insulation layer. The flexible display panel may not include a flexible base, and instead, the insulation layer may serve as the base of the flexible display panel. The CTE of the insulation layer is relatively low, so it is able to prevent the flexible display panel from being rolled up during the manufacture of the flexible display panel, thereby to meet the requirement on the flatness of the flexible display panel. In addition, the insulation layer may be provided with a relatively small thickness, so as to move a neutral layer of the flexible display panel upward, reduce a distance between the packaging layer and the neutral layer, and remarkably reduce a bending stress, thereby to prevent the packaging layer from taking no effect when bending the flexible display panel, and improve a yield of the flexible display panel.

In some embodiments of the present disclosure, in order to ensure a structural strength of the flexible display panel, as shown in FIG. 1, the flexible display panel may further include an insulation support layer 5 arranged between the insulation layer 4 and the driving circuit layer. The insulation support layer 5 may be of an SOG structure and have a thickness greater than 2 μm.

In some embodiments of the present disclosure, in order to ensure the performance of the TFT in the driving circuit layer and prevent external light from irradiating the active layer 10 of the TFT, the flexible display panel may further include a light-shielding layer 6 arranged between the insulation layer 4 and the driving circuit layer. An orthogonal projection of the active layer 10 of the TFT in the driving circuit layer onto the insulation layer 4 may fall within an orthogonal projection of the light-shielding layer 6 onto the insulation layer 4. In this way, it is able to shield the external light through the light-shielding layer 6, thereby to prevent the performance of the TFT from being adversely affected when the external light irradiates the active layer 10 of the TFT. The light-shielding layer 6 may be made of a light-absorbing material, or a reflective metal. As shown in FIG. 1, two opposite surfaces of the light-shielding layer 6 may be in contact with the insulation support layer 5 and the insulation layer 4 respectively.

In the embodiments of the present disclosure, the flexible display panel may be a flexible transparent rollable display panel. When the flexible display panel is the flexible transparent rollable display panel, as shown in FIG. 1, the flexible display panel may include a light-transmitting region B and a light-emitting region A. It is unnecessary to display an image at the light-transmitting region B, and in order to ensure a high light transmittance at the light-transmitting region B, the light-shielding layer 6 may be arranged at only the light-emitting region A. As shown in FIG. 1, the flexible display panel may further include a buffer layer 7 arranged at a side of the insulation support layer 5 distal to the insulation layer 4, and the active layer 10 of the TFT may be arranged at a side of the buffer layer 7 distal to the insulation layer 4. Through the buffer layer 7, it is able to prevent impurities from entering the active layer 10. The buffer layer 7 may be made of an inorganic insulation material, e.g., SiN, SiO, SiON or $Al_2O_3$. In addition, through the buffer layer 7, it is also able to effectively block the external air and moisture. The buffer layer 7 may alternatively be made of an organic resin and have a thickness of 0.6 μm to 3 μm. When the buffer layer 7 is made of the inorganic insulation material, it may have a thickness of 100 nm to 800 nm, and when the buffer layer 7 is made of the organic insulation material, it may have a thickness of 1 μm to 3 μm.

As shown in FIG. 1, the flexible display panel may further include a planarization layer 9 arranged at a side of the driving circuit layer distal to the insulation layer 4 and configured to provide a flat surface for the anode layer 15. The anode layer 15 may be connected to the drain electrode 14 of the driving TFT in the driving circuit layer through a via-hole penetrating through the planarization layer 9.

In some embodiments of the present disclosure, in order to reduce an IR drop on the cathode layer 18 and ensure the display uniformity, the flexible display panel may further include an auxiliary electrode 23 arranged between the cathode layer 18 and the packaging layer. The auxiliary electrode 23 may be connected in parallel to the cathode layer 18, so as to reduce a resistance of the cathode layer 18, thereby to reduce the IR drop on the cathode layer 18. The auxiliary electrode may be made of metal. In order to prevent the display effect from being adversely affected by the auxiliary, the auxiliary electrode 23 may be arranged at a non-light-emitting region between the pixel regions, and an orthogonal projection of the auxiliary electrode 23 onto the insulation layer 4 may overlap an orthogonal projection of the pixel definition layer 16 onto the insulation layer 4 at an overlapping region. In a possible embodiment of the present disclosure, the orthogonal projection of the auxiliary electrode 23 onto the insulation layer 4 may fall within the orthogonal projection of the pixel definition layer 16 onto the insulation layer 4.

The resistance of the cathode layer 18 may be effectively reduced through the auxiliary electrode 23, so a thickness of the cathode layer 18 at the pixel region may be reduced appropriately. The cathode layer 18 may include a first portion 181 and a second portion 182 other than the first portion 181. A thickness of the first portion 181 may be greater than a thickness of the second portion 182, and an orthogonal projection of the first portion 181 onto the insulation layer 4 may coincide with the orthogonal projection of the auxiliary electrode 23 onto the insulation layer 4, i.e., the portion of the cathode layer 18 corresponding to the auxiliary electrode 23 may have a large thickness and the portion of the cathode layer 18 at the other region may have a small thickness, so as to remarkably increase the transparency of the flexible display panel.

In some embodiments of the present disclosure, the flexible display panel may further include a color filter layer 25 arranged at a side of the packaging layer distal to the insulation layer, and a packaging cover plate 22 arranged at a side of the color filter layer 25 distal to the insulation layer. The color filter layer 25 may include a plurality of color filter units in different colors, so as to enable the flexible display panel to achieve colorful display. The packaging cover plate 22 may be made of CPI which has a light transmittance greater than 99%, so as to remarkably increase the luminous efficiency of the flexible display panel.

In the embodiments of the present disclosure, the flexible display panel may be a flexible transparent rollable display panel. When the flexible display panel is the flexible transparent rollable display panel, as shown in FIG. 1, the flexible display panel may include a light-transmitting region B and a light-emitting region A, and it is unnecessary to display an image at the light-transmitting region B. In order to ensure a high light transmittance at the light-transmitting region B, the anode layer 15 may be arranged at only the light-emitting region A. Further, the cathode layer 18 may also be arranged at only the light-emitting region A.

The present disclosure further provides in some embodiments a display device including the above-mentioned flexible display panel. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, tablet computer, television, wearable electronic device or navigator.

The display device may be any product or member having a display function, e.g., television, display, digital photo frame, mobile phone or tablet computer. The display device may further include a flexible circuit board, a printed circuit board and a back plate.

The present disclosure further provides in some embodiments a method for manufacturing a flexible display panel, which includes: providing a rigid support plate; forming a transitional flexible base on the rigid support plate; forming a sacrificing layer on the transitional flexible base; forming an insulation layer on the sacrificing layer, wherein the CTE of the insulation layer is smaller than a first threshold, the light transmittance of the insulation layer is greater than a second threshold; forming a driving circuit layer and a light-emitting element on the insulation layer, the light-emitting element including an anode layer, a pixel definition layer, a light-emitting layer and a cathode layer; forming a packaging layer covering the light-emitting element; peeling the transitional flexible base off from the sacrificing layer; and removing the sacrificing layer.

In the embodiments of the present disclosure, the flexible display panel may include the insulation layer and the display elements on the insulation layer. The flexible display panel may not include a flexible base. Instead, after the formation of the light-emitting element on the transitional flexible base, the transitional flexible base may be peeled off, and the insulation layer may serve as the base of the flexible display panel. The CTE of the insulation layer is relatively low, so it is able to prevent the flexible display panel from being rolled up during the manufacture of the flexible display panel, thereby to meet the requirement on the flatness of the flexible display panel. In addition, the insulation layer may be provided with a relatively small thickness, so as to move a neutral layer of the flexible display panel upward, reduce a distance between the packaging layer and the neutral layer, and remarkably reduce a bending stress, thereby to prevent the packaging layer from taking no effect when bending the flexible display panel, and improve a yield of the flexible display panel.

In a specific embodiment of the present disclosure, as shown in FIGS. 2 to 7, the method for manufacturing the flexible display panel may include the following steps.

Figure 2:
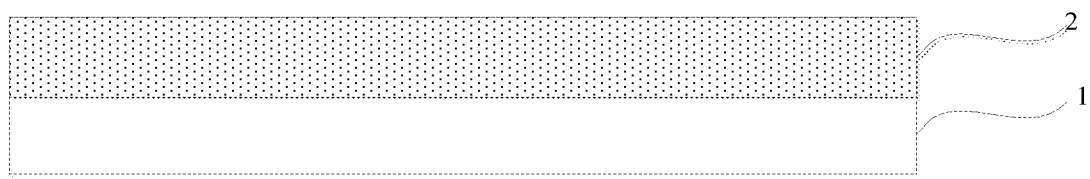
FIGS. 2-7 are schematic views showing the manufacture of the flexible display panel according to an embodiment of the present disclosure.

Step 1: as shown in FIG. 2, the rigid support plate 1 may be provided, and the transitional flexible base 2 may be formed on the rigid support plate 1.

The rigid support plate 1 may be a glass or quartz substrate. The transitional flexible base 2 may be made of polyimide and have a thickness of 5 μm to 10 μm. To be specific, the transitional flexible base 2 may be formed on the rigid support plate 1 through a coating process.

Figure 3:
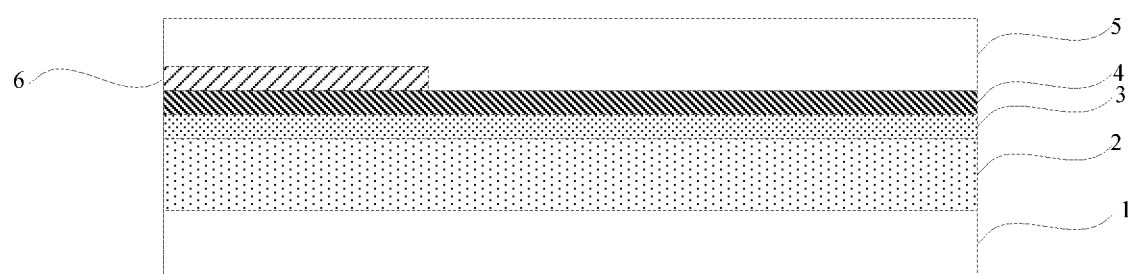

Step 2: as shown in FIG. 3, the sacrificing layer 3, the insulation layer 4, the light-shielding layer 6 and the insulation support layer 5 may be formed sequentially in that order on the transitional flexible base 2.

The sacrificing layer 3 may be made of a material with a low adhesive force, so as to facilitate the subsequent removal of the transitional flexible base 2. The sacrificing layer 3 may have a thickness of 300 Å to 700 Å. Because the thickness of the sacrificing layer 3 is relatively small, it is unnecessary to remove the sacrificing layer 3 either. When the sacrificing layer 3 is not removed, the sacrificing layer 3 may be made of a material with a high light transmittance, e.g., a material with a light transmittance greater than 95%.

The insulation layer 4 may be made of an inorganic insulation material such as SiN, SiO, SiON or $Al_2O_3$, and it may be formed through Plasma Enhanced Chemical Vapor Deposition (PECVD). The insulation layer 4 may alternatively be made of an organic resin, and when the insulation layer 4 is made of the organic resin, the insulation layer 4 may be formed through a coating process. The insulation layer 4 may have a thickness of 0.6 μm to 3 μm. When the insulation layer 4 is made of the inorganic insulation material, it may have a thickness of 100 nm to 800 nm. When the insulation layer 4 is made of the organic insulation material, it may have a thickness of 1 μm to 3 μm, but it is necessary to ensure that the CTE of the insulation layer 4 is relatively small. The first threshold may be within a range of 5 to 15, e.g., 10. The light transmittance of the insulation layer 4 required to be high, so as to prevent a display effect of the display panel from being adversely affected. The second threshold may be within a range of 90% to 99%, e.g., 95%. When the insulation layer 4 is made of the inorganic insulation material, e.g., SiN, SiO, SiON or $Al_2O_3$, to form the base of the display panel, it is able for the insulation layer 4 to effectively prevent external air and moisture from entering the display panel due to such advantages of the inorganic insulation material as high temperature resistance, being hard to aging, and high mechanical strength.

The light-shielding layer 6 may shield external light, so as to prevent the performance of the TFT from being adversely affected when the active layer 10 of the TFT is irradiated by the external light. The light-shielding layer 6 may be made of a light-absorbing material or a reflective metal, e.g., a multi-layer structure of Ti/Al/Ti. In order to prevent the display effect of the flexible display panel from being adversely affected by the light-shielding layer 6, the light-shielding layer 6 may be arranged at only a light-emitting region of the flexible display panel. Further, an orthogonal projection of the light-shielding layer 6 onto the insulation layer 4 may coincide with an orthogonal projection of the active layer 10 onto the insulation layer 4. During the manufacture of the light-shielding layer 6 using metal, a metal layer may be deposited through sputtering or thermal evaporation. Next, a photoresist layer may be coated onto the metal layer, and exposed with a mask plate, so as to form a photoresist reserved region corresponding to a region where a pattern of the light-shielding layer 6 is located and a photoresist unreserved region corresponding to the other region. Next, developing treatment may be performed so as to full remove the photoresist at the photoresist unreserved region, and maintain a thickness of the photoresist at the photoresist reserved region. Finally, the metal layer at the photoresist unreserved region may be etched off through an etching process, and the remaining photoresist may be removed, so as to form the pattern of the light-shielding layer 6.

The insulation support layer 5 may be used to ensure a structural strength of the flexible display panel. To be specific, it may be of an SOG structure and have a thickness greater than 2 μm.

Figure 4:
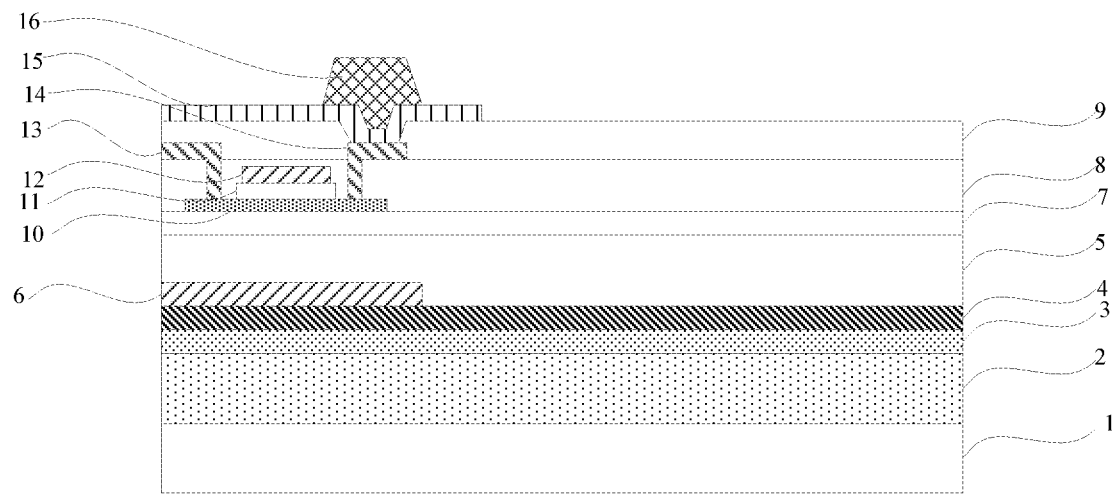

Step 3: as shown in FIG. 4, the buffer layer 7, the driving circuit layer, the anode layer 15 and the pixel definition layer 16 may be formed.

The buffer layer 7 may be made of an inorganic insulation material such as SiN, SiO, SiON or $Al_2O_3$, and the buffer layer 7 may be formed through PECVD. In addition, the buffer layer 7 may alternatively be made of an organic resin. When the buffer layer 7 is made of the organic resin, it may be formed through a coating process. The buffer layer 7 may have a thickness of 0.6 μm to 3 μm. When the buffer layer 7 is made of the inorganic insulation material, it may have a thickness of 100 nm to 800 nm, and when the buffer layer 7 is made of the organic insulation material, it may have a thickness of 1 μm to 3 μm. Through the buffer layer 7, it is able to effectively prevent external air and moisture from entering the display panel.

The driving circuit layer may include such film layers as a TFT, a gate line and a data line. The TFT may include the active layer 10, the gate insulation layer 11, the gate electrode 12, the source electrode 13, the drain electrode 14 and the interlayer insulation layer 8. The anode layer 15 may be connected to the drain electrode 14 of the driving TFT in the driving circuit layer through a via-hole penetrating through the planarization layer 9. The pixel definition layer 16 is configured to define a plurality of pixel regions.

Figure 5:
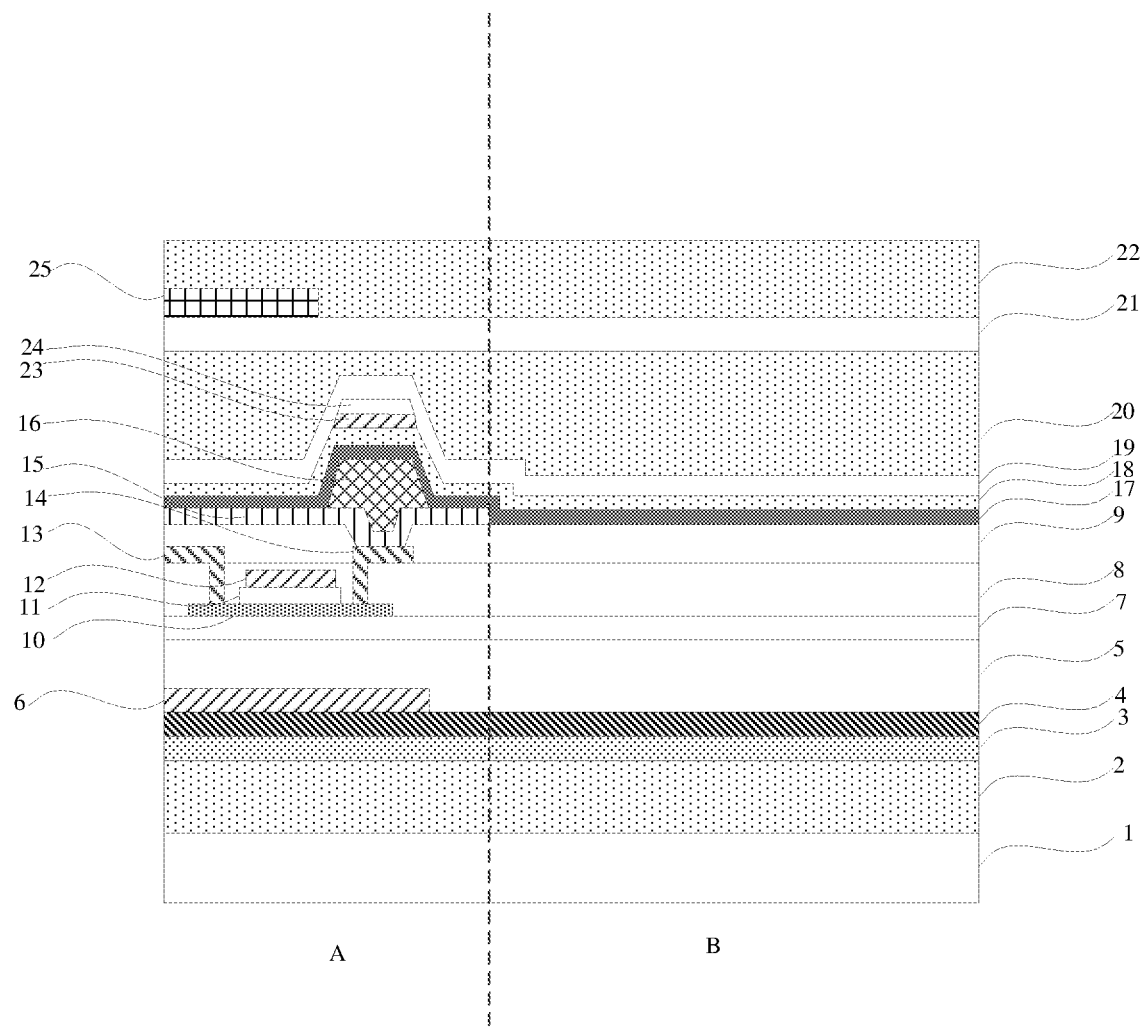

In the embodiments of the present disclosure, the flexible display panel may be a flexible transparent rollable display panel. As shown in FIG. 5, the flexible display panel may include a light-transmitting region B and a light-emitting region A, and it is unnecessary to display an image at the light-transmitting region B. In order to ensure a high light transmittance at the light-transmitting region, the anode layer 15 may be arranged at only the light-emitting region A.

Step 4: as shown in FIG. 5, the light-emitting layer 17, the cathode layer 18, the auxiliary electrode 23, an insulation pattern 24, the packaging layer, the color filter layer 25 and the packaging cover plate 22 may be formed.

To be specific, the light-emitting layer 17 and the cathode layer 18 may be formed sequentially in that order through evaporation.

In order to reduce a voltage of the cathode layer 18, it is necessary to form the auxiliary electrode 23 connected in parallel to the cathode layer 18. At first, an auxiliary electrode material layer may be formed, and then the insulation pattern 24 may be formed. Next, the auxiliary electrode material layer may be etched with the insulation pattern 24 as a mask, so as to form the auxiliary electrode 23. In order to prevent an aperture ratio from being adversely affected by the auxiliary electrode 23, the auxiliary electrode 23 may be arranged at a non-light-emitting region between the pixel regions. An orthogonal projection of the auxiliary electrode 23 onto the insulation layer 4 may overlap an orthogonal projection of the pixel definition layer 16 onto the insulation layer 4 at an overlapping region. In a possible embodiment of the present disclosure, the orthogonal projection of the auxiliary electrode 23 onto the insulation layer 4 may fall within the orthogonal projection of the pixel definition layer 16 onto the insulation layer 4.

The first inorganic packaging layer 19, the second organic packaging layer 20 and the third inorganic packaging layer 21 may be formed sequentially in that order to form the packaging layer.

The color filter layer 25 may include a plurality of color filter units in different colors, so as to enable the flexible display panel to achieve colorful display.

The packaging cover plate 22 may be made of CPI with a light transmittance greater than 99%, so as to remarkably increase the luminous efficiency of the flexible display panel.

In the embodiments of the present disclosure, the flexible display panel may be a flexible transparent rollable display panel. As shown in FIG. 5, the flexible display panel may include a light-transmitting region B and a light-emitting region A, and it is unnecessary to display an image at the light-transmitting region B. In order to ensure a high light transmittance at the light-transmitting region, the cathode layer 18 may be arranged at only the light-emitting region A.

Figure 6:
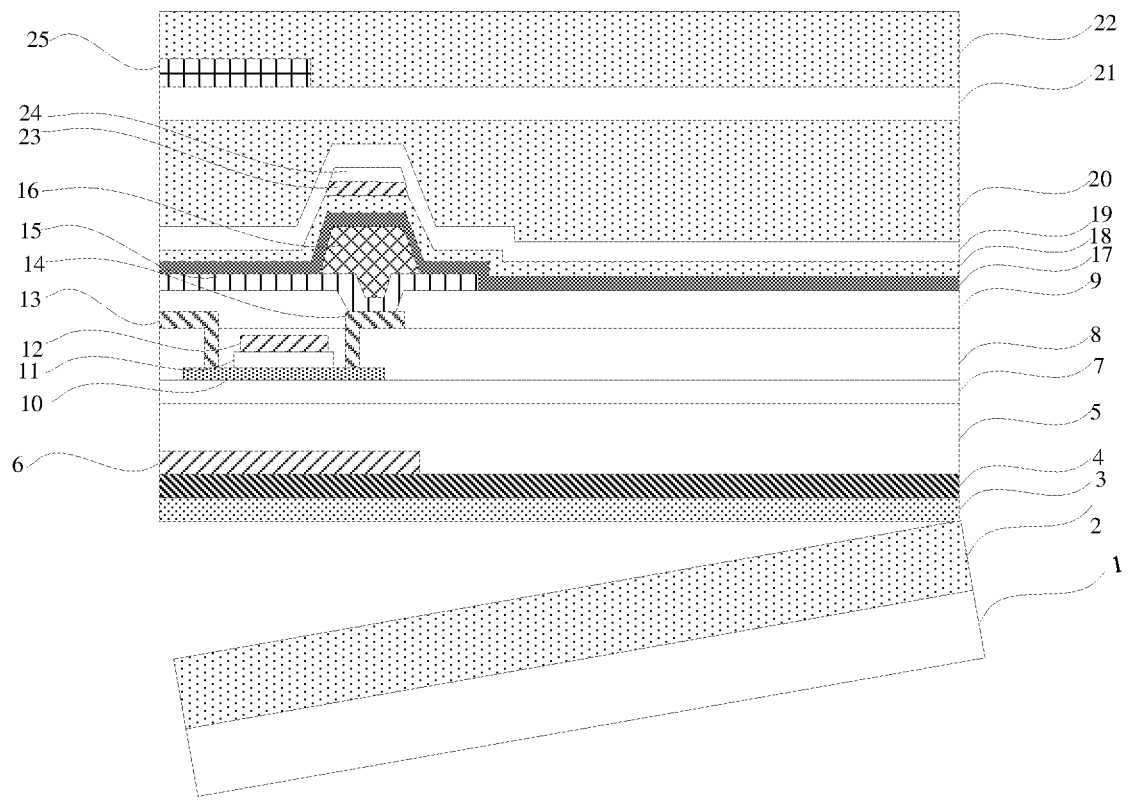

Step 5: as shown in FIG. 6, the transitional flexible base 2 may be peeled off.

To be specific, the transitional flexible base 2 may be peeled off from the sacrificing layer 3 through laser lift-off.

Figure 7:
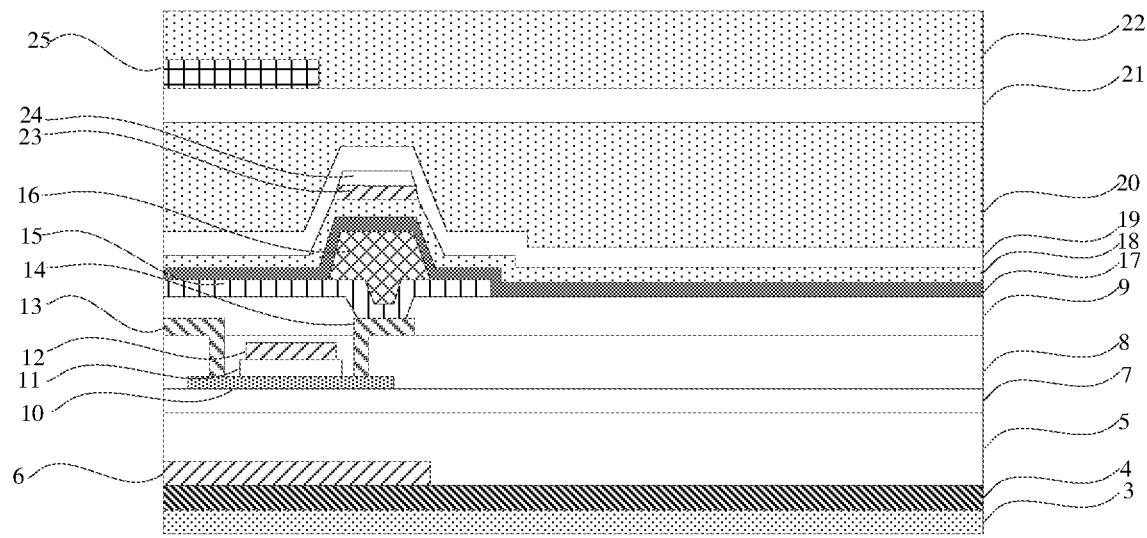

Step 6: as shown in FIG. 7, the sacrificing layer 3 may be removed.

To be specific, the sacrificing layer 3 may be removed through an ashing process, or the sacrificing layer 3 may be peeled off from the insulation layer 4 through mechanical exfoliation.

Through the above steps, the flexible display panel in FIG. 1 will be acquired.

In the embodiments of the present disclosure, the order of the steps is not limited to the serial numbers thereof. For a person skilled in the art, any change in the order of the steps shall also fall within the scope of the present disclosure without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship may be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within a protection scope of the present disclosure. Therefore, the protection scope of the present disclosure is defined by claims.

What is claimed is:

1. A flexible display panel, comprising a packaging layer, a driving circuit layer and an insulation layer,
wherein the insulation layer serves as a base of the flexible display panel, and is located at a side of the driving circuit layer distal to the packaging layer, each of a Coefficient of Thermal Expansion (CTE) and a light transmittance of the insulation layer is within a respective predetermined range, the CTE of the insulation layer is smaller than a first threshold, the light transmittance of the insulation layer is greater than a second threshold;
the first threshold is within a range of 5 to 15 ppm/° C., and the second threshold is within a range of 90% to 99%,
the flexible display panel further comprises:
an insulation support layer arranged between the insulation layer and the driving circuit layer, and configured to ensure a structural strength of the flexible display panel,
wherein the insulation support layer is of a Silicon On Glass (SOG) structure, and a thickness of the insulation support layer is greater than 2 μm.

2. The flexible display panel according to claim 1, wherein the driving circuit layer is arranged on the insulation layer, and the flexible display panel further comprises:
an anode layer arranged at a side of the driving circuit layer distal to the insulation layer and connected to an output electrode of a driving Thin Film Transistor (TFT) in the driving circuit layer;
a pixel definition layer arranged at a side of the anode layer distal to the insulation layer;
a light-emitting layer arranged at a side of the pixel definition layer distal to the insulation layer;
a cathode layer arranged at a side of the light-emitting layer distal to the insulation layer,
wherein the packaging layer is arranged at a side of the cathode layer distal to the insulation layer.

3. The flexible display panel according to claim 2, further comprising:
a light-shielding layer arranged between the insulation layer and the driving circuit layer, wherein an orthogonal projection of an active layer of the TFT in the driving circuit layer onto the insulation layer is within an orthogonal projection of the light-shielding layer onto the insulation layer.

4. The flexible display panel according to claim 1, further comprising:
a light-shielding layer arranged between the insulation layer and the driving circuit layer,
wherein an orthogonal projection of an active layer of the TFT in the driving circuit layer onto the insulation layer is within an orthogonal projection of the light-shielding layer onto the insulation layer, the light-shielding layer is made of metal, and two opposite surfaces of the light-shielding layer are in contact with the insulation layer and the insulation support layer respectively.

5. The flexible display panel according to claim 3, further comprising:
a buffer layer arranged at a side of the active layer proximate to the insulation layer,
wherein a thickness of the insulation layer is within a range of 0.6 μm to 3 μm.

6. The flexible display panel according to claim 2, further comprising:
an auxiliary electrode arranged between the cathode layer and the packaging layer and connected in parallel to the cathode layer,
wherein an orthogonal projection of the auxiliary electrode onto the insulation layer overlaps an orthogonal projection of the pixel definition layer onto the insulation layer at an overlapping region.

7. The flexible display panel according to claim 6, wherein the cathode layer comprises a first portion and a second portion other than the first portion, a thickness of the first portion is greater than a thickness of the second portion, and an orthogonal projection of the first portion onto the insulation layer coincides with the orthogonal projection of the auxiliary electrode onto the insulation layer.

8. The flexible display panel according to claim 1, further comprising:
a color filter layer arranged at a side of the packaging layer distal to the insulation layer;
a packaging cover plate arranged at a side of the color filter layer distal to the insulation layer.

9. The flexible display panel according to claim 8, wherein the packaging cover plate is made of Colorless Polyimide (CPI).

10. The flexible display panel according to claim 3, wherein the flexible display panel comprises a light-transmitting region and a light-emitting region, and the anode layer and the light-shielding layer are arranged at only the light-emitting region.

11. The flexible display panel according to claim 1, wherein
the insulation layer is made of an inorganic insulation material, and a thickness of the insulation layer is within a range of 100 nm to 800 nm; or
the insulation layer is made of an organic resin, and a thickness of the insulation layer is within a range of 0.6 μm to 3 μm; or
the insulation layer is made of an organic insulation material, and a thickness of the insulation layer is within a range of 1 μm to 3 μm.

12. The flexible display panel according to claim 2, further comprising:
a planarization layer arranged at a side of the driving circuit layer distal to the insulation layer,
wherein the anode layer is connected to the output electrode through a via-hole penetrating through the planarization layer.

13. A display device, comprising the flexible display panel according to claim 1.

14. A method for manufacturing a flexible display panel, comprising:
providing a rigid support plate;
forming a transitional flexible base on the rigid support plate;
forming a sacrificing layer on the transitional flexible base;

forming an insulation layer on the sacrificing layer, wherein each of a CTE and a light transmittance of the insulation layer is within a respective predetermined range;

forming a driving circuit layer and a light-emitting element on the insulation layer, the light-emitting element comprising an anode layer, a pixel definition layer, a light-emitting layer and a cathode layer;

forming a packaging layer covering the light-emitting element;

peeling the transitional flexible base off from the sacrificing layer; and removing the sacrificing layer, wherein the flexible display panel further comprises:

an insulation support layer arranged between the insulation layer and the driving circuit layer, and configured to ensure a structural strength of the flexible display panel, wherein the insulation support layer is of a Silicon On Glass (SOG) structure, and a thickness of the insulation support layer is greater than 2 μm.

15. The method according to claim 14, wherein the CTE of the insulation layer is smaller than a first threshold, the light transmittance of the insulation layer is greater than a second threshold, the first threshold is within a range of 5 to 15 ppm/° C., and the second threshold is within a range of 90% to 99%.

16. The method according to claim 14, wherein the forming the transitional flexible base on the rigid support plate comprises:

forming the transitional flexible base on the rigid support plate through a coating process, wherein the transitional flexible substrate is made of polyimide.

17. The method according to claim 14, wherein the removing the sacrificing layer comprises:

removing the sacrificing layer through an ashing process.

18. The method according to claim 14, wherein a thickness of the transitional flexible substrate is within a range of 5 μm to 10 μm, and a thickness of the sacrificing layer is within a range of 300 Å to 700 Å.

19. A flexible display panel, comprising a packaging layer, a driving circuit layer and an insulation layer, wherein the insulation layer serves as a base of the flexible display panel, and is located at a side of the driving circuit layer distal to the packaging layer, each of a Coefficient of Thermal Expansion (CTE) and a light transmittance of the insulation layer is within a respective predetermined range, the CTE of the insulation layer is smaller than a first threshold, the light transmittance of the insulation layer is greater than a second threshold;

the first threshold is within a range of 5 to 15 ppm/° C., and the second threshold is within a range of 90% to 99%, the flexible display panel further comprises:

a color filter layer arranged at a side of the packaging layer distal to the insulation layer;

a packaging cover plate arranged at a side of the color filter layer distal to the insulation layer.

* * * * *